ized Patent

(12) United States Patent
Kim et al.

(10) Patent No.: US 6,924,228 B2
(45) Date of Patent: Aug. 2, 2005

(54) METHOD OF FORMING A VIA CONTACT STRUCTURE USING A DUAL DAMASCENE TECHNIQUE

(75) Inventors: Il-Goo Kim, Seongnam (KR); Sang-Rok Hah, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/748,900

(22) Filed: Dec. 30, 2003

(65) Prior Publication Data

US 2004/0175932 A1 Sep. 9, 2004

(30) Foreign Application Priority Data

Mar. 6, 2003 (KR) .................................. 10-2003-0014122

(51) Int. Cl.⁷ ......................................... H01L 21/4763
(52) U.S. Cl. ........................ 438/636; 438/675; 257/652
(58) Field of Search ...................... 438/624, 635–639, 438/672–675, 694–697, 699–703, 705, 717–719, 723–725, 735–736, 942, 947, 950, 952, 970, 976; 257/437, 622, 652, 749

(56) References Cited

U.S. PATENT DOCUMENTS

| | | | | | |
|---|---|---|---|---|---|
| 5,539,255 | A | * | 7/1996 | Cronin .......................... | 257/750 |
| 6,060,380 | A | * | 5/2000 | Subramanian et al. ....... | 438/618 |
| 6,156,643 | A | * | 12/2000 | Chan et al. .................. | 438/638 |
| 6,218,287 | B1 | * | 4/2001 | Matsumoto ................. | 438/624 |
| 6,309,962 | B1 | * | 10/2001 | Chen et al. .................. | 438/638 |
| 6,312,874 | B1 | * | 11/2001 | Chan et al. .................. | 430/314 |
| 6,319,809 | B1 | * | 11/2001 | Chang et al. ................ | 438/597 |
| 6,323,121 | B1 | * | 11/2001 | Liu et al. .................... | 438/633 |
| 6,383,912 | B1 | * | 5/2002 | Chung et al. ................ | 438/624 |
| 6,406,995 | B1 | * | 6/2002 | Hussein et al. .............. | 438/638 |
| 6,514,852 | B2 | * | 2/2003 | Usami ......................... | 438/624 |
| 6,548,401 | B1 | * | 4/2003 | Trivedi ........................ | 438/638 |
| 6,573,168 | B2 | * | 6/2003 | Kim et al. ................... | 438/586 |
| 6,583,047 | B2 | * | 6/2003 | Daniels et al. .............. | 438/623 |
| 6,649,515 | B2 | * | 11/2003 | Moon et al. ................. | 438/637 |
| 6,724,069 | B2 | * | 4/2004 | Dalton et al. ................ | 257/642 |
| 6,743,713 | B2 | * | 6/2004 | Mukherjee-Roy et al. .. | 438/638 |
| 6,787,448 | B2 | * | 9/2004 | Chung ......................... | 438/624 |
| 6,812,131 | B1 | * | 11/2004 | Kennedy et al. ............ | 438/624 |
| 2001/0021581 | A1 | * | 9/2001 | Moon et al. ................. | 438/637 |
| 2003/0077894 | A1 | * | 4/2003 | Ryu ............................. | 438/622 |
| 2003/0082905 | A1 | * | 5/2003 | Hung et al. .................. | 438/633 |
| 2003/0119305 | A1 | * | 6/2003 | Huang et al. ................ | 438/633 |
| 2003/0137055 | A1 | * | 7/2003 | Trivedi ........................ | 257/774 |
| 2003/0157806 | A1 | * | 8/2003 | Nagahara et al. ........... | 438/694 |
| 2003/0203321 | A1 | * | 10/2003 | Ma et al. ..................... | 430/316 |
| 2004/0036076 | A1 | * | 2/2004 | Arita et al. .................. | 257/79 |
| 2004/0100779 | A1 | * | 5/2004 | Kraft .......................... | 361/760 |

\* cited by examiner

*Primary Examiner*—David Nelms
*Assistant Examiner*—Calvin Lee
(74) *Attorney, Agent, or Firm*—F. Chau & Associates, LLC

(57) ABSTRACT

A method of forming a via contact structure using a dual damascene technique is provided. The method includes forming a lower interconnection line on a semiconductor substrate and sequentially forming an inter-metal dielectric layer and a hard mask layer on the semiconductor substrate having the lower interconnection line. The hard mask layer and the inter-metal dielectric layer are successivley patterned to form a via hole that exposes the lower interconnnection line. A sacrificial layer filling the via hole is formed on the hard mask layer. The sacrificial layer and the hard mask layer are patterned to form a first sacrificial layer pattern having an opening that crosses over the via hole and a second sacrificial layer pattern that remains in the via hole and to simultaneously form a hard mask pattern underneath the first sacrificial layer pattern. The inter-metal dielectric layer is partially etched using the hard mask pattern as an etching mask, thereby forming a trench in the inter-metal dielectric layer. The second sacrificial layer pattern is selectively removed to expose the the lower interconnection line.

27 Claims, 6 Drawing Sheets

US 6,924,228 B2

METHOD OF FORMING A VIA CONTACT STRUCTURE USING A DUAL DAMASCENE TECHNIQUE

BACKGROUND

1. Technical Field

The present invention relates generally to a method of fabricating a semiconductor device, and more particularly, to a method of forming a via contact structure using a dual damascene technique.

2. Discussion of Related Art

As semiconductor devices become more highly integrated, a technique employing multi-layered metal interconnection lines has been widely used. Generally, multi-layered metal interconnection lines are formed of a metal layer having a low resistivity and a high reliability to improve the performance of the semiconductor devices. A copper layer is attractive as a metal layer. However, a copper layer is difficult to pattern using a conventional photolithography/etching technique. Thus, a damascene process has been proposed to obtain fine copper patterns.

A dual damascene process is widely used in formation of upper metal lines that are electrically connected to lower metal lines. In addition, the upper metal lines fill a via hole and a trench region formed in an inter-metal dielectric layer. The via hole is formed to expose a predetermined region of the lower metal line, and the trench region is formed to have a line-shaped groove that crosses over the via hole. Thus, the via hole and the trench region are formed using two separated etching steps.

The dual damascene process is taught in U.S. Pat. No. 6,268,283 to Huang, entitled "Method for forming dual damascene structure".

FIGS. 1 through 4 are cross-sectional views illustrating a conventional dual damascene process as disclosed in the U.S. Pat. No. 6,268,283.

Referring to FIG. 1, a first insulating layer 204 is formed on a semiconductor substrate having a lower interconnection line 202. An etch stop layer 206, a second insulating layer 208 and a hard mask layer 210 are sequentially formed on the first insulating layer 204. The hard mask layer 210 is formed of a silicon oxide layer (SiO), a silicon nitride layer (SiN) or a silicon oxynitride layer (SiON). The hard mask layer 210 is formed using a chemical vapor deposition (CVD) technique. A first photoresist pattern 212 is formed on the hard mask layer 210. The first photoresist pattern 212 has an opening that defines a via hole. The second insulating layer 208 is not damaged by a developer during formation of the first photoresist pattern 212 because of the presence of the hard mask layer 210. Thus, the hard mask layer 210 can prevent the second insulating layer 208 from being deformed during formation of the first photoresist pattern 212.

Referring now to FIG. 2, the hard mask layer 210, the second insulating layer 208, the etch stop layer 206 and the first insulating layer 204 are sequentially etched using the first photoresist pattern 212 as an etching mask, thereby forming a via hole 214 that exposes the lower interconnection line 202.

Referring to FIG. 3, the first photoresist pattern 212 is removed. A capping layer 216 is then formed on the hard mask layer 210. The capping layer 216 is formed using a plasma CVD process. In general, the plasma CVD process exhibits poor step coverage. Therefore, the capping layer 216 covers only an upper region 218 of the via hole 214. Thus, a void is formed in a lower region 220 of the via hole 214. A second photoresist pattern 224 is formed on the capping layer 216. The second photoresist pattern 224 has an opening that crosses over the via hole 214. A sidewall 222 of the via hole 214 is not damaged by a developer during formation of the second photoresist pattern 224 because of the presence of the capping layer 216.

Referring to FIG. 4, using the second photoresist pattern 224 as an etching mask, the capping layer 216, the hard mask layer 210 and the second insulating layer 208 are sequentially etched to form a trench 226 in the second insulating layer 208. The lower interconnection line 202 exposed by the via hole 214 may be over-etched during formation of the trench 226 because of the void formed in the via hole 214. Thus, the surface of the lower interconnection line 202 may be damaged by the etching process for forming the trench and cause contact failure between the lower interconnection line 202 and an upper interconnection line to be formed in a subsequent process.

Therefore, there is a need for a method of fabricating a via contact structure in a semiconductor device that prevents contact failure between interconnection lines within the semiconductor device.

SUMMARY OF THE INVENTION

Embodiments of the invention include a method of fabricating a via contact structure. The method comprises forming a lower interconnection line on a semiconductor substrate. An inter-metal dielectric layer and a hard mask layer are sequentially formed on an entire surface of the semiconductor substrate having the lower interconnection line. The hard mask layer and the inter-metal dielectric layer are successively patterned to form a via hole that exposes the lower interconnection line. A sacrificial layer filling the via hole is formed on the hard mask layer. The sacrificial layer and the hard mask layer are patterned to form a first sacrificial layer pattern having an opening that crosses over the via hole and a second sacrificial layer pattern remained in the via hole, and to simultaneously form a hard mask pattern underneath the first sacrificial layer pattern. The inter-metal dielectric layer is partially etched using the hard mask patern as an etching mask, thereby forming a trench. The second sacrifical layer pattern is then removed to expose the lower interconnection line.

In an exemplary embodiment of the present invention, a via etch stop layer may be formed on an entire surface of the semicondcutor substrate having the lower interconnection line prior to formation of the inter-metal dielectric layer. In addition, the via etch stop layer is etched after removal of the second sacrificial layer pattern, thereby exposing the lower interconnection line. Thus, a final via hole exposing the lower interconnection line is formed after etching the via etch stop layer.

In another exemplary embodiment of the present invention, the sacrificial layer and the hard mask layer may be successively patterned using a photoresist pattern formed on the sacrificial layer as an etching mask. In addition, the trench can be formed by removing the photoresist pattern and partially etching the inter-metal dielectric layer using the patterned hard mask layer, or the hard mask pattern, as the etching mask.

In yet another exemplary embodiment of the present invention, the sacrificial layer and the hard mask layer can be patterned using two distinct etching processes. For example, the sacrificial layer may be etched using a photoresist pattern formed on the sacrificial layer as an etching mask, and the hard mask layer may be etched using the patterned sacrificial layer as an etching mask after removal of the photoresist pattern.

Preferably, the hard mask layer is formed of an insulating layer or a conductive layer, having an etch selectivity with respect to the inter-metal dielectirc layer and the sacrificial layer.

In still another exemplary embodiment of the present invention, an upper metal interconnection line may be formed in the via hole exposing the lower interconnection line and in the trench crossing over the via hole, after removal of the second sacrificial layer pattern. The formation of the upper metal interconnection line comprises forming an upper metal layer on an entire surface of the substrate having the via hole and the trench and planarizing the upper metal layer. Further, if the hard mask layer is formed of a conductive layer, then the hard mask pattern is removed during or after the planarization of the upper metal layer.

DETAILED DESCRIPTION OF EXEMPLARY EMBODIMENTS

Figure 1:
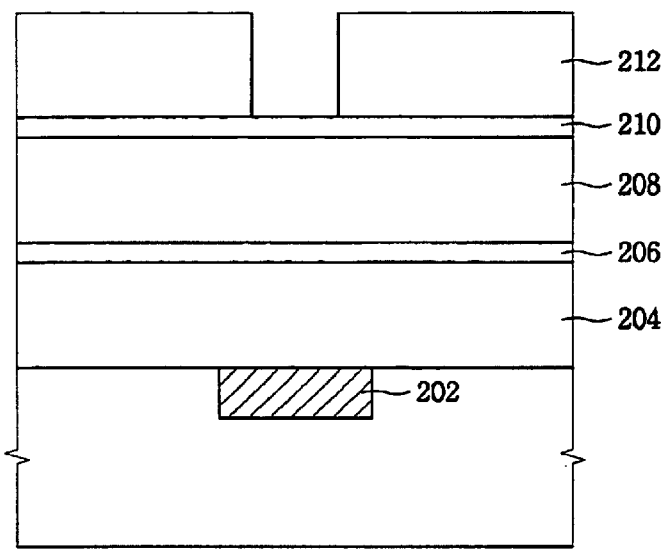
FIGS. 1 through 4 are cross-sectional views illustrating a conventional method of forming a via contact structure.
Figure 2:
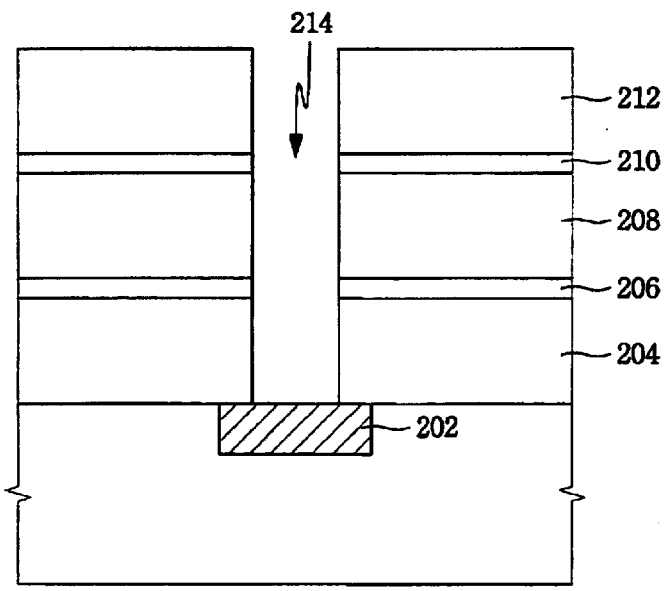
Figure 3:
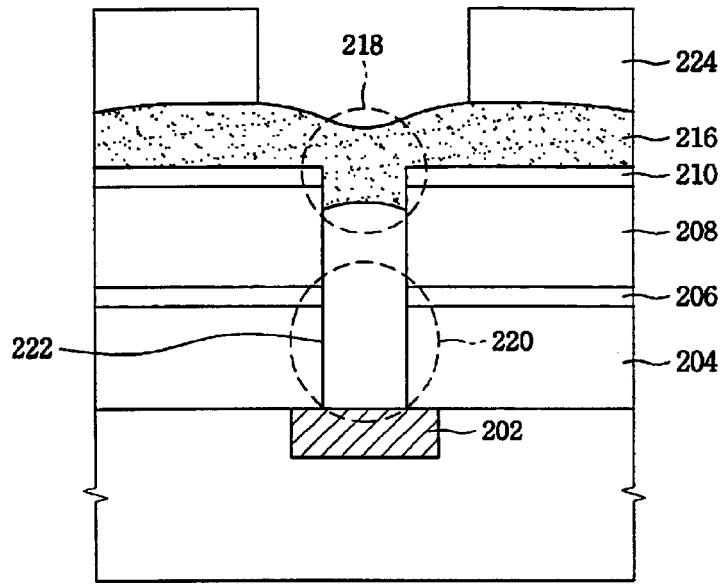
Figure 4:
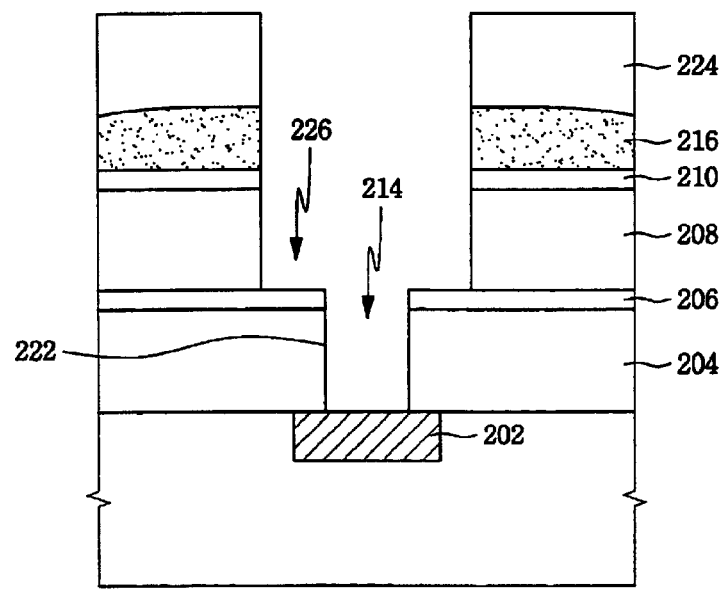

The present invention will now be described more fully hereinafter with reference to the accompanying drawings, in which exemplary embodiments of the invention are shown. This invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. In the drawings, the thickness of layers and regions are exaggerated for clarity. Like reference numerals refer to like elements throughout the specification.

FIGS. 5 through 10 are cross-sectional views illustrating methods of forming a via contact structure according to exemplary embodiments of the present invention.

Figure 5:
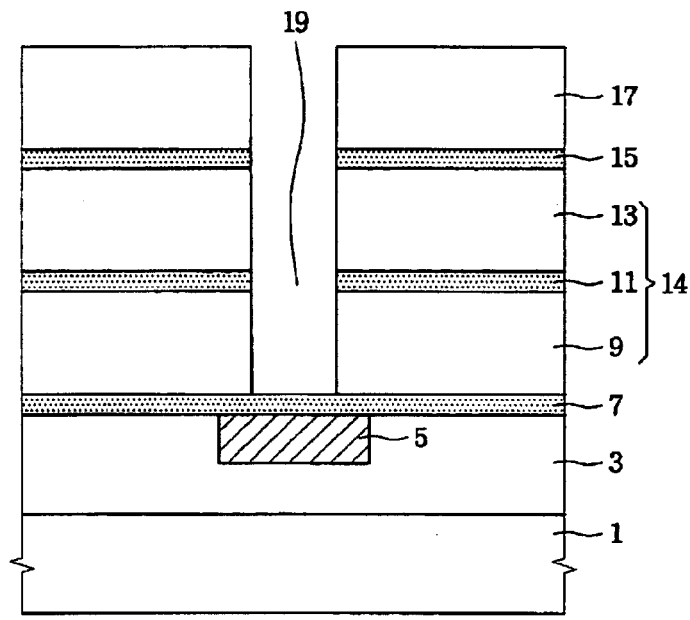
FIGS. 5 through 10 are cross-sectional views illustrating methods of forming a via contact structure according to exemplary embodiments of the present invention.

Referring to FIG. 5, an interlayer insulating layer 3 is formed on a semiconductor substrate 1. A lower interconnection line 5 is formed in the interlayer insulating layer 3 using a damascene technique. The lower interconnection line 5 may be formed of a metal layer such as a copper layer or a tungsten layer. An inter-metal dielectric layer 14 and a hard mask layer 15 are sequentially formed on an entire surface of the semiconductor substrate having the lower interconnection line 5. The inter-metal dielectric layer 14 is preferably formed of a single low-k dielectric layer, an insulating layer having a low dielectric constant, to enhance the operating speed of a semiconductor device. For example, the low-k dielectric layer can be formed of a silicon oxide layer doped with carbon, fluorine or hydrogen atoms, e.g., a silicon oxycarbide (SiOC) layer, a SiOCH layer, a fluoro-silses-quioxane layer (FSQ) layer, a hydro-silses-quioxane (HSQ) layer or a methyl-silses-quioxane (MSQ) layer.

Further, the inter-metal dielectric layer 14 may be formed by sequentially stacking a lower inter-metal dielectric layer 9, a trench etch stop layer 11 and an upper inter-metal dielectric layer 13. Preferably, the lower inter-metal dielectric layer 9 and the upper inter-metal dielectric layer 13 are formed of an aforementioned low-k dielectric layer, and the trench etch stop layer 11 is preferably formed of an insulating layer having an etching selectivity with respect to the lower inter-metal dielectric layer 9 and the upper inter-metal dielectric layer 13. For instance, the trench etch stop layer 11 may be formed of a silicon nitride (SiN) layer, a silicon carbonitride (SiCN) layer, a silicon carbide (SiC) layer or a boron nitride (BN) layer.

Furthermore, a via etch stop layer 7 may be formed on an entire surface of the substrate having the lower interconnection line 5 prior to formation of the inter-metal dielectric layer 14. Preferably, the via etch stop layer 7 is formed of an insulating layer having an etching selectivity with respect to the inter-metal dielectric layer 14 or the lower inter-metal dielectric layer 9. For example, the via etch stop layer 7 may be formed of a silicon nitride (SiN) layer, a silicon carbonitride (SiCN) layer, a silicon carbide (SiC) layer or a boron nitride (BN) layer.

In addition, the hard mask layer 15 is preferably formed of an insulating layer or a conductive layer that has an etching selectivity with respect to the inter-metal dielectric layer 14. For example, the hard mask layer 15 may be formed of an insulating nitride layer, an insulating carbide layer, a metal nitride layer, a metal oxide layer or a silicon layer. Further, the insulating nitride layer can be formed of a silicon nitride layer (SiN), a silicon carbonitride layer (SiCN) or a boron nitride layer (BN), and the insulating carbide layer can be formed of a silicon carbide layer (SiC). Also, the metal nitride layer can be formed of a tantalum nitride (TaN) layer, a titanium nitride (TiN) layer, a tungsten nitride (WN) layer or an aluminum nitride (AlN) layer, and the metal oxide layer can be formed of an aluminum oxide ($AL_2O_3$) layer, a tantalum oxide (TaO) layer or a titanium oxide (TiO) layer. Further, the silicon layer can be formed of an amorphous silicon layer or a polycrystalline silicon layer.

A first photoresist pattern 17 is formed on the hard mask layer 15. Using the first photoresist pattern 17 as an etching mask, the hard mask 15 and the inter-metal dielectric layer 14 are successively etched to form a preliminary via hole 19 that exposes the via etch stop layer 7 on the lower interconnection line 7. Further, if a via etch stop layer 7 is not formed on a semiconductor substrate, then a final via hole is formed to expose the lower interconnection line 7.

Figure 6:
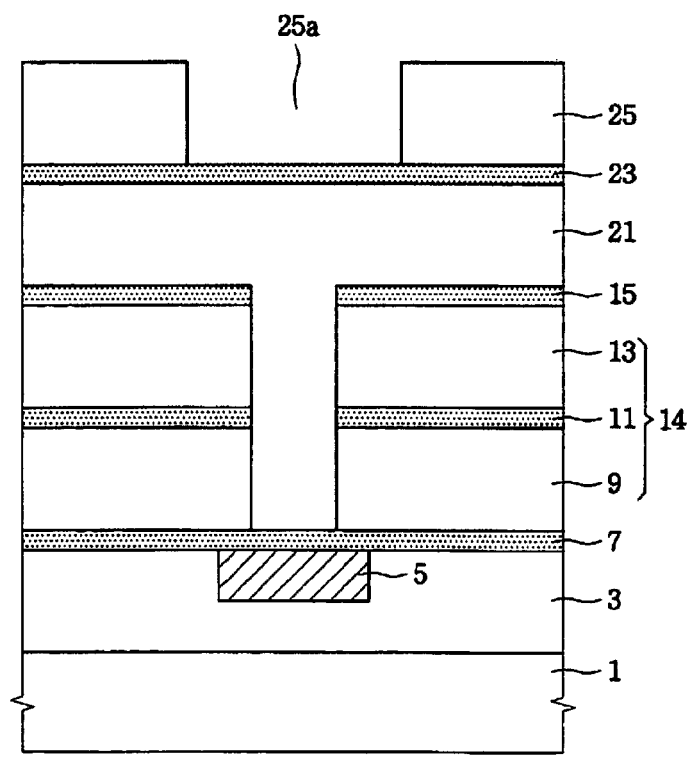

Referring to FIG. 6, the first photoresist pattern 17 is removed, and a sacrificial layer 21 is formed on an entire surface of the substrate where the first photoresist pattern 17 is removed. The sacrificial layer 21 may be formed of an inorganic material layer or an organic material layer. Preferably, the sacrificial layer 21 is formed of an inorganic material layer having a wet etching selectivity and a dry etching selectivity with respect to the inter-metal dielectric layer 14 and the hard mask layer 15, respectively. In addition, the inorganic material layer is preferably formed of a HSQ (hydro-silses-quioxane) layer using a spin coating technique. Thus, the preliminary via hole 19 is completely filled with the sacrificial layer 21, and the sacrificial layer 21 may have a substantially planar top surface.

Further, an anti-reflective layer 23 may be formed on the sacrificial layer 21. A second photoresist pattern 25 may be formed on the anti-reflective layer 23. In addition, the second photoresist pattern 25 is formed to have a line-shaped trench opening 25a that crosses over the preliminary via hole 19.

Figure 7A:
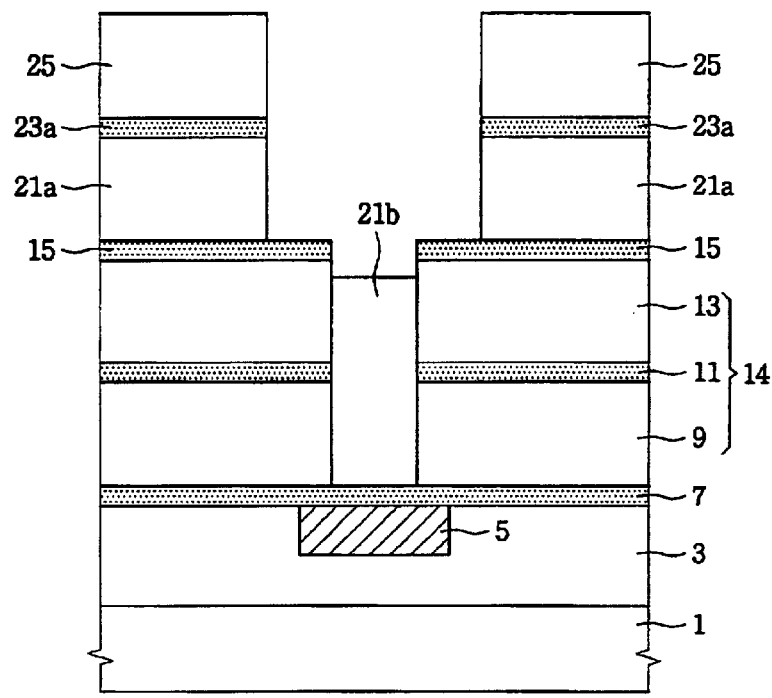

Referring to FIG. 7A, using the second photoresist pattern 25 as an etching mask, the anti-reflective layer 23 and the sacrificial layer 21 are successively etched to form a first sacrificial layer pattern 21a under the second photoresist pattern 25 and a second sacrificial layer pattern 21b in the preliminary via hole 19. Thus, an anti-reflective layer pattern 23a is formed between the second sacrificial layer pattern 21b and the second photoresist pattern 25.

Figure 7B:
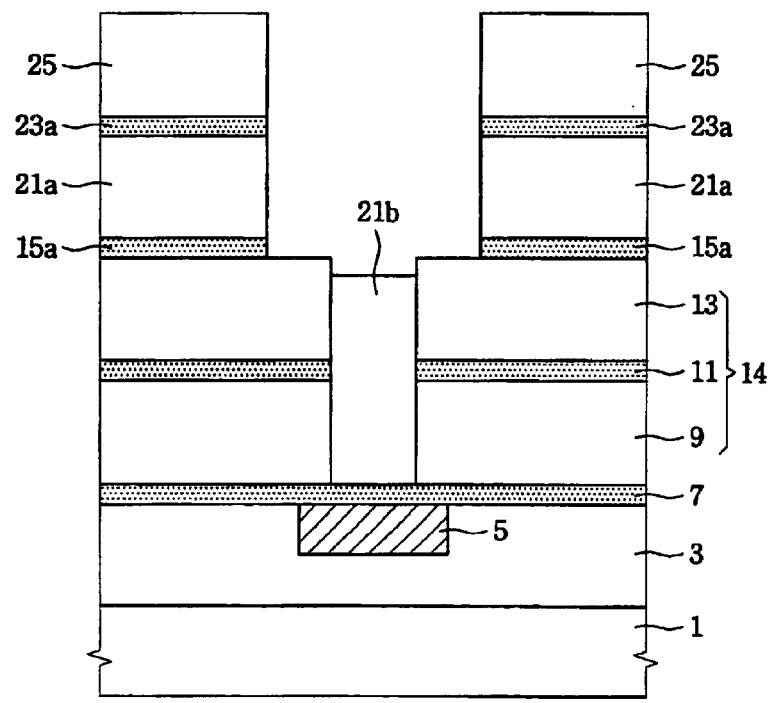

Referring to FIG. 7B, the anti-reflection layer 23, the sacrifice layer 21 and the hard mask layer 15 may be successively etched using the second photoresist pattern 25 as an etching mask. Thus, a hard mask pattern 15a is formed under the first sacrificial layer pattern 21a in addition to the first sacrificial layer pattern 21a, the anti-reflective layer pattern 23a and the second sacrificial layer pattern 21b.

Figure 8:
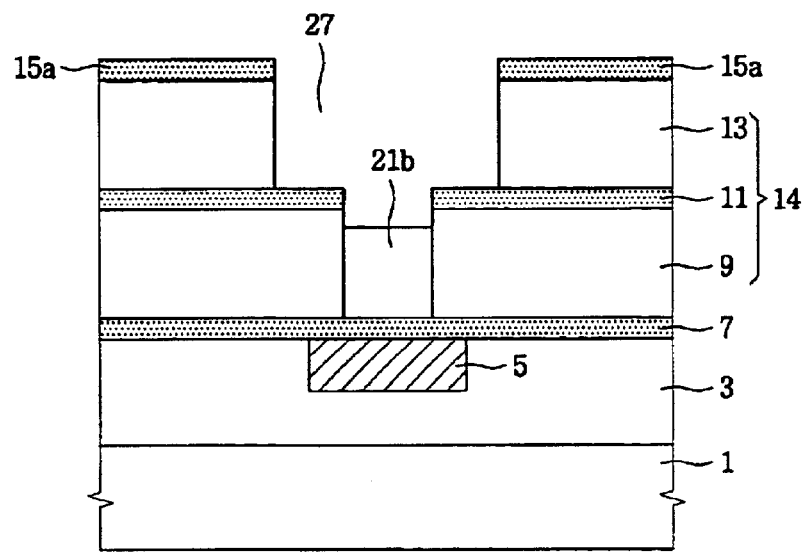

Referring to FIG. 8, the second photoresist pattern 25 illustrated in FIG. 7A or FIG. 7B is removed. If the anti-reflective layer 23 and the sacrificial layer 21 are etched using the second photoresist pattern 25 as an etching mask, as discussed with reference to FIG. 7A, then the hard mask pattern 15a shown in FIG. 7B can be formed by etching the hard mask layer 15 using the first sacrificial layer pattern 21a as an etching mask. Using the hard mask pattern 15a as an etching mask, the upper inter-metal dielectric layer 14 is etched until the trench etch stop layer 11 is exposed. Thus, a trench 27 crossing over the via hole 19 is formed in the upper inter-metal dielectric layer 14. In addition, the anti-reflective layer pattern 23a may be removed during removal of the second photoresist pattern 25 or formation of the trench 27, and the first sacrificial layer pattern 21a may be removed during formation of the trench 27.

Further, as discussed with reference to FIG. 7B, when the anti-reflective layer 23, the sacrificial layer 21 and the hard mask layer 15 are sequentially etched using the second photoresist pattern 25 as an etching mask, an additional etching process for forming the hard mask pattern 15a is not required.

Furthermore, if the inter-metal dielectric layer 14, as discussed above in reference to FIG. 5, is formed of a single low-k dielectric layer, the trench 27 can be formed by partially etching the inter-metal dielectric layer 14. In other words, the trench 27 is formed having a depth less than the thickness of the inter-metal dielectric layer 14.

In FIG. 7B or FIG. 8, the etching process for forming the hard mask pattern 15a is preferably performed using a chlorine-based gas or a fluorine-based gas. Further, if the hard mask layer 15 is formed of a tantalum nitride layer, a titanium nitride layer, a tungsten nitride layer, an aluminum nitride layer or a silicon layer, then the chlorine-based gas, e.g., a chlorine ($Cl_2$) gas or a boron chloride ($BCl_3$) gas, is preferably used as the etching gas. In addition, if the hard mask layer 15 is formed of a silicon nitride layer, a silicon carbonitride layer, a silicon carbide layer or a boron nitride layer, then the fluorine-based gas, e.g., a $CF_4$ gas, a $CH_2F_2$ gas or a $CHF_3$ gas, is preferably used as the etching gas.

Figure 9:
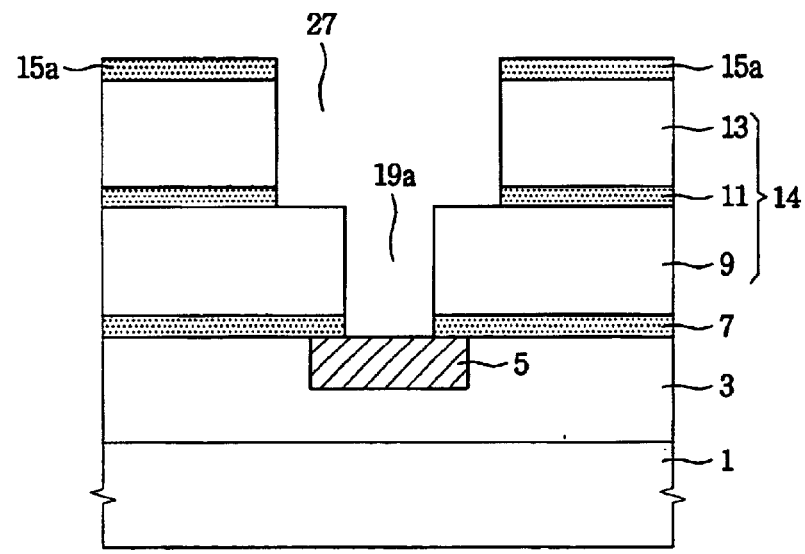

Referring now to FIG. 9, the second sacrificial layer pattern 21b in the preliminary via hole 19 is selectively removed to expose a predetermined region of the via etch stop layer 7. The second sacrificial layer pattern 21b can be removed by a wet etching process using hydrofluoric acid (HF) or a dry etching process using plasma. The exposed via etch stop layer 7 is then etched to form a final via hole 19a that exposes the lower interconnection line 5. When the exposed via etch stop layer 7 is etched, the trench etch stop layer 11 exposed by the trench 27 may also be etched.

Further, if the formation of the via etch stop layer 7 is omitted, the predetermined region of the lower interconnection line 5 can be exposed by removing the second sacrificial layer pattern 21b.

Figure 10:
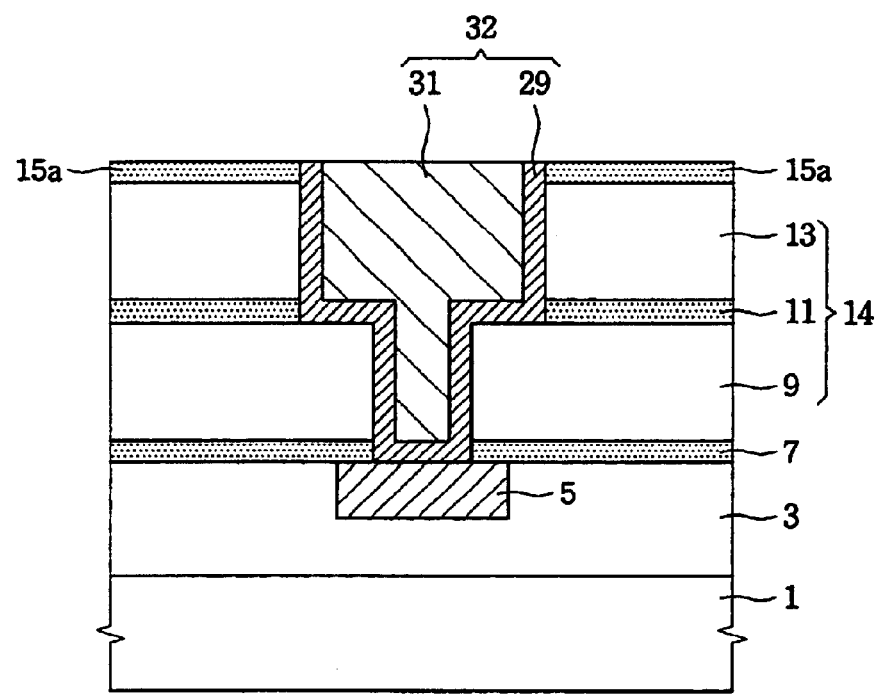

Referring to FIG. 10, an upper metal layer is formed on an entire surface of the substrate having the final via hole 19a. The upper metal layer may be formed by sequentially stacking a diffusion barrier layer and a metal layer. The diffusion barrier layer is formed of a conductive metal nitride layer such as a tantalum nitride layer or a titanium nitride layer, and the metal layer is formed of a copper layer or a tungsten layer. The metal layer and the diffusion barrier layer are planarized to form an upper metal interconnection line 32 in the trench 27 and the final via hole 19a. The planarization process may be performed using a chemical-mechanical polishing technique. Therefore, the upper metal interconnection line 32 comprises a diffusion barrier layer pattern 29 and a metal layer pattern 31, which are sequentially stacked. If the hard mask pattern 15a is formed of a conductive layer, the hard mask pattern 15a is removed during or after the planarization process. However, if the hard mask pattern 15a is formed of an insulating layer, the hard mask pattern 15a may exist even after the planarization process.

As discussed above, a second sacrificial layer pattern still remains in a via hole even after formation of a trench. Therefore, a second sacrificial can minimize the etching damage to a lower interconnection line and prevent contact failure between interconnection lines within a semiconductor device.

While the present invention has been particularly shown and described with reference to exemplary embodiments thereof, it will be understood by those skilled in the art that the foregoing and other changes in form and details may be made therein without departing from the spirit and scope of the present invention.

What is claimed is:

1. A method of forming a via contact structure, the method comprising the steps of:
    forming a lower interconnection line over a semiconductor substrate;
    sequentially forming an inter-metal dielectric layer and a hard mask layer on an entire surface of the semiconductor substrate having the lower interconnection line;
    patterning the hard mask layer and the inter-metal dielectric layer to form a via hole exposing the lower interconnection line;
    forming a sacrificial layer filling the via hole on the hard mask layer;
    forming an anti-reflective layer on the sacrificial layer;
    patterning the sacrificial layer, the anti-reflective layer, and the hard mask layer to form a first sacrificial layer pattern having an opening that crosses over the via hole and a second sacrificial layer pattern that remains in the via hole, and to simultaneously form a hard mask pattern underneath the first sacrificial layer pattern;
    partially etching the inter-metal dielectric layer using the hard mask pattern as an etching mask to form a trench crossing over the via hole; and
    removing the second sacrificial layer pattern to expose the lower interconnection line.

2. The method according to claim 1, wherein the inter-metal dielectric layer is formed of a single layer of insulating material, the trench being formed to a depth less than the total thickness of the inter-metal dielectric layer.

3. The method according to claim 1, wherein the inter-metal dielectric layer is formed by sequentially stacking a lower inter-metal dielectric layer, a trench etch stop layer and an upper inter-metal dielectric layer, the trench being formed by etching the upper inter-metal dielectric layer until the trench etch stop layer is exposed.

4. The method according to claim 3, wherein the trench etch stop layer is formed of an insulating nitride layer or an insulating carbide layer that has an etching selectivity with respect to the upper inter-metal dielectric layer.

5. The method according to claim 4, wherein the insulating nitride layer is a silicon nitride layer, a silicon carbonitride layer (SiCN) or a boron nitride layer (BN), and the insulating carbide layer is a silicon carbide layer (SiC).

6. The method according to claim 1, wherein the hard mask layer is formed of an insulating nitride layer, an insulating carbide layer, a metal nitride layer, a metal oxide layer or a silicon layer that has an etching selectivity with respect to the inter-metal dielectric layer and the sacrificial layer.

7. The method according to claim 6, wherein the insulating nitride layer is a silicon nitride layer (SiN), a silicon carbonitride layer (SiCN) or a boron nitride layer (BN), the insulating carbide layer is a silicon carbide layer (SiC), the metal nitride layer is a tantalum nitride layer or a titanium nitride layer, the metal oxide layer is an aluminum oxide layer (Al2O3), a tantalum oxide layer or a titanium oxide layer, and the silicon layer is a polycrystalline silicon layer or an amorphous silicon layer.

8. The method according to claim 1, wherein the sacrificial layer is formed of an inorganic material layer.

9. The method according to claim 8, wherein the inorganic material layer is a hydro-silses-quioxane (HSQ) layer formed by using a spin coating technique.

10. The method according to claim 1, wherein the step of patterning the sacrificial layer, the anti-reflective layer, and the hard mask layer comprises the sub-steps of:
    forming a photoresist pattern on the sacrificial layer and the anti-reflective layer, the photoresist pattern having an opening that crosses over the via hole;
    etching the anti-reflective layer and the sacrificial layer using the photoresist pattern as an etching mask to form the first sacrificial layer pattern having an opening that crosses over the via hole and the second sacrificial layer pattern that remains in the via hole;
    removing the photoresist pattern; and
    etching the hard mask layer using the first sacrificial layer pattern as the etching mask to form the hard mask pattern underneath the first sacrificial layer pattern.

11. The method according to claim 1, wherein the step of patterning the anti-reflective layer, the sacrificial layer and the hard mask layer comprises the sub-steps of:
    forming a photoresist pattern on the anti-reflective layer and the sacrificial layer, the photoresist pattern having an opening that crosses over the via hole;
    successively etching the sacrificial layer-, the anti-reflective layer and the hard mask layer using the photoresist pattern as an etching mask to form the first sacrificial layer pattern having an opening that crosses over the via hole and the second sacrificial layer pattern that remains in the via hole, and to simultaneously form the hard mask pattern underneath the first sacrificial layer pattern; and
    removing the photoresist pattern.

12. The method according to claim 1 further comprising the steps of:
    forming an upper metal layer by depositing a metal layer on the semiconductor substrate including the via hole and the trench after removal of the second sacrificial layer pattern, wherein the via hole and the trench are filled with the metal layer; and
    planarizing the upper metal layer to form an upper metal interconnection line.

13. The method according to claim 12, wherein the upper metal layer is formed by sequentially stacking a diffusion barrier layer and the metal layer.

14. The method according to claim 12, wherein the hard mask pattern is formed of a conductive layer or a semiconductor layer, the hard mask pattern is removed during or after the planarization process.

15. A method of forming a via contact structure, the method comprising the steps of:
    forming a lower interconnection line over a semiconductor substrate;
    sequentially forming a via etch stop layer, a lower inter-metal dielectric layer, a trench etch stop layer, an upper inter-metal dielectric layer and a hard mask layer on an entire surface of the semiconductor substrate having the lower interconnection line;
    patterning the hard mask layer, the upper inter-metal dielectric layer, the trench etch stop layer and the lower inter-metal dielectric layer to form a preliminary via hole that exposes the via etch stop layer on the lower interconnection line;
    forming a sacrificial layer filling the preliminary via hole on the hard mask layer;
    forming an anti-reflective layer on the sacrificial layer;
    patterning the anti-reflective layer, the sacrificial layer and the hard mask layer to form a first sacrificial layer pattern having an opening that crosses over the preliminary via hole and a second sacrificial layer pattern that remains in the preliminary via hole, and to simultaneously form a hard mask pattern underneath the first sacrificial layer pattern;
    etching the upper inter-metal dielectric layer using the hard mask pattern and the trench etch stop layer as an etching mask and an etch stop layer respectively, thereby forming a trench in the upper inter-metal dielectric layer;
    selectively removing the second sacrificial layer pattern to expose the via etch stop layer; and
    etching the exposed via etch stop layer to form a final via hole that exposes the lower interconnection line.

16. The method according to claim 15, wherein the via etch stop layer is formed of an insulating nitride layer or an insulating carbide layer that has an etching selectivity with respect to the lower inter-metal dielectric layer.

17. The method according to claim 16, wherein the insulating nitride layer is a silicon nitride layer (SiN), a silicon carbonitride layer (SiCN) or a boron nitride layer (BN), and the insulating carbide layer is a silicon carbide layer (SiC).

18. The method according to claim 17, wherein the trench etch stop layer is formed of an insulating nitride layer or an insulating carbide layer that has an etching selectivity with respect to the upper inter-metal dielectric layer.

19. The method according to claim 18, wherein the insulating nitride layer is a silicon nitride layer, a silicon carbonitride layer (SiCN) or a boron nitride layer (BN), and the insulating carbide layer is a silicon carbide layer (SiC).

20. The method according to claim 15, wherein the hard mask layer is formed of an insulating nitride layer, an insulating carbide layer, a metal nitride layer, a metal oxide layer or a silicon layer that has an etching selectivity with respect to the upper inter-metal dielectric layer and the sacrificial layer.

21. The method according to claim 20, wherein the insulating nitride layer is a silicon nitride layer (SiN), a silicon carbonitride layer (SiCN), or a boron nitride layer (BN), the insulating carbide layer is a silicon carbide layer (SiC), the metal nitride layer is a tantalum nitride layer or a titanium nitride layer, the metal oxide layer is an aluminum oxide (Al2O3) layer, a tantalum oxide layer or a titanium oxide layer, and the silicon layer is a polycrystalline silicon layer or an amorphous silicon layer.

22. The method according to claim 15, wherein the step of patterning the anti-reflective layer, the sacrificial layer and the hard mask layer comprises the sub-steps of:

forming a photoresist pattern on the anti-reflective layer and the sacrificial layer, the photoresist pattern having an opening that crosses over the preliminary via hole;

etching the anti-reflective layer and the sacrificial layer using the photoresist pattern as an etching mask to form the first sacrificial layer pattern having an opening that crosses over the preliminary via hole and the second sacrificial layer pattern that remains in the preliminary via hole;

removing the photoresist pattern; and etching the hard mask layer using the first sacrificial layer pattern as the etching mask to form the hard mask pattern underneath the first sacrificial layer pattern.

23. The method according to claim 15, wherein the step of patterning the anti-reflective layer, the sacrificial layer and the hard mask layer comprises the sub-steps of:

forming a photoresist pattern on the anti-reflective layer and the sacrificial layer, the photoresist pattern having an opening that crosses over the preliminary via hole;

successively etching the sacrificial layer and the hard mask layer using the photoresist pattern as an etching mask to form the first sacrificial layer pattern having an opening that crosses over the preliminary via hole and the second sacrificial layer pattern that remains in the preliminary via hole, and to simultaneously form the hard mask pattern underneath the first sacrificial layer pattern; and removing the photoresist pattern.

24. The method according to claim 15 further comprising the steps of:

forming an upper metal layer by depositing a metal layer on the semiconductor substrate including the final via hole and the trench after formation of the final via hole, wherein the final via hole and the trench are filled with the metal layer; and planarizing the upper metal layer to form an upper metal interconnection line.

25. The method according to claim 24, wherein the upper metal layer is formed by sequentially stacking a diffusion barrier layer and the metal layer.

26. The method according to claim 24, wherein the hard mask pattern is formed of a conductive layer or a semiconductor layer, the hard mask pattern is removed during or after the planarization process.

27. A method of forming a via contact structure, the method comprising the steps of:

forming a lower interconnection line over a semiconductor substrate;

forming a via etch stop layer on the semiconductor substrate having the lower interconnection line;

sequentially forming an inter-metal dielectric layer and a hard mask layer on an entire surface of the semiconductor substrate having the lower interconnection line;

patterning the hard mask layer and the inter-metal dielectric layer to form a preliminary via hole exposing a surface of the via etch stop layer;

forming a sacrificial layer filling the via hole on the hard mask layer;

forming an antireflective layer on the sacrificial layer;

patterning the antireflective layer, the sacrificial layer and the hard mask layer to form a first sacrificial layer pattern having an opening that crosses over the via hole and a second sacrificial layer pattern that remains in the via hole, and to simultaneously form a hard mask pattern underneath the first sacrificial layer pattern;

partially etching the inter-metal dielectric layer using the hard mask pattern as an etching mask to form a trench crossing over the via hole;

removing the second sacrificial layer pattern to expose the surface of the via etch stop layer; and removing the via etch stop layer to form a final via hole that exposes the lower interconnection line.

* * * * *